United States Patent [19]

Matsuhiro et al.

[11] 4,282,272

[45] Aug. 4, 1981

[54] METHOD FOR FORMING ELECTROCHROMIC FILM

[75] Inventors: Kenzi Matsuhiro, Sagamihara; Yasushi Masuda, Yamato, both of Japan

[73] Assignee: Asahi Glass Company, Limited, Tokyo, Japan

[21] Appl. No.: 45,651

[22] Filed: Jun. 5, 1979

[30] Foreign Application Priority Data

Jun. 9, 1978 [JP] Japan .................. 53-68764

[51] Int. Cl.³ .................. B05D 5/12; G02F 1/01
[52] U.S. Cl. .................. 427/126.3; 427/376.2; 427/248.1; 427/255; 427/255.2; 350/357
[58] Field of Search .......... 350/357; 427/126, 248 B, 427/248 C, 255, 126.3, 255.2, 255.1, 255, 248.1, 376.2

[56] References Cited

U.S. PATENT DOCUMENTS 3,978,007  8/1976  Giglia et al. .................. 350/357

OTHER PUBLICATIONS

Green et al., Thin Solid Films, 24 (1974), S45–S46, *A Solid State Electrochromic Cell.*
Brown, Boveri Symposium on Nonemissive Electrooptic Displays, ©1976, Plenum Press, N.Y.
Giglia, *Features of an Electrochromic Display Device*, American Cyanamid Co., 5-11-76.
Green et al., Thin Solid Films, 40 (1977), L19–L21, Solid State Cells: The M-β-alumina/WO₃ system.

*Primary Examiner*—Ronald H. Smith
*Assistant Examiner*—Richard Bueker
*Attorney, Agent, or Firm*—Oblon, Fisher, Spivak, McClelland & Maier

[57] ABSTRACT

An amorphous electrochromic film prepared by vacuum evaporation under relatively high pressure of $2\times10^{-4} - 2\times10^{-3}$ torr.

The evaporated film is porous with packing density less than 0.65 and exhibits excellent reversibility after heat treatment at 250° C.–350° C. whereby it is optimum for an electrochromic device sealed with a sealant of tetrafluoroethylene-ethylene copolymer having no reactivity with electrolyte, low moisture permeability, excellent chemical properties and good adhesiveness.

7 Claims, 2 Drawing Figures

METHOD FOR FORMING ELECTROCHROMIC FILM

BACKGROUND OF THE INVENTION

1. Field of the Invention

The present invention relates to a method for forming an electrochromic film and an electrochromic device using the same. More particularly, it relates to a method for forming an electrochromic film exhibits excellent reversibility after heat-treatment.

2. Description of the Prior Arts

An electrochromic device is prepared by facing a pair of substrate (1) having an amorphous electrochromic film (3) such as tungsten or molybdenum oxide film and a transparent electrode (2) made of tin oxide etc., and sealing them with a sealant (4) and filling an electrolyte (5) containing ions such as $Li^+$ and $H^+$ which colors the electrochromic films, as shown in FIG. 1. If necessary, a pigment such as $TiO_2$ powder or a thin porous separator made of $Al_2O_3$ is incorporated in the electrolyte.

The electrolytes used in the electrochromic device highly affects to reliability of the electrochromic device. Various electrolytes have been proposed. In view of long life of the electrochromic device, it has been well known to use an electrolyte prepared by dissolving $LiClO_4$ in an organic solvent such as propylenecarbonate, and acetonitrile at a concentration of 1 mole/liter in U.S. Pat. Nos. 3,521,941; 3,708,220; 3,978,007 and 4,059,341.

The sealant for sealing such electrolyte is significantly important to highly affect to the reliability of the electrochromic device as well as the electrolyte. The required characteristics for the sealant include high bonding strength, low moisture permeability, chemical resistance to the electrolyte used and low sealing temperature. The sealing temperature is dependent upon the characteristics of the electrochromic film. The amorphous $WO_3$ may lose its significant electrochromic characteristic by a heat-treatment at a temperature higher than 300° C. even though it has been used.

Heretofore, amorphous $WO_3$, and $MoO_3$ have been used as the electrochromic film. Recently, $V_2O_5$ have been known as the electrochromic film. Among them, the $WO_3$ film has been widely studied and its electrochromic characteristic has been studied in detail.

It has been known to prepare a $WO_3$ film by a spraying method, a vacuum evaporation method and a sputtering method. Because of low heat resistance of $WO_3$, the electrochromic characteristic is lost when the temperature of the substrate in the formation of film is too high such as higher than about 320° C. in the spraying method and higher than about 300° C. in the vacuum evaporation method.

In the heat treatment of the resulting electrofilm, it has been known to substantially lose the electrochromic characteristic by heating it at about 300° C. (H. R. Zeller and H. U. Beyeler, Electrochromism and Local Order in Amorphous $WO_3$; Applied Physics Vol. 13, page 231-237 (1977)).

In the sputtering method, the characteristic of the resulting film is not stable. The authors have reported various films such as a film having no electrochromic characteristic and a film being similar to the film obtained by the vacuum evaporation method. These $WO_3$ films concern to its heat resistance or non-stability.

Accordingly, a glass frit having high reliability which has been used in a liquid crystal device can not be used when the amorphous $WO_3$ is used.

On the other hand, a sealant having lower sealing temperature range such as an epoxy sealand has not been enough to give reliability after sealing the electrolyte. Accordingly, the inventors have proposed an electrochromic device which is sealed with a sealant made of an ethylene-tetrafluoroethylene copolymer (Japanese Patent Application 6721/1978; filing date of Jan. 26, 1978). The temperature in the heat-treatment is ranging from 250° C. to 350° C. which causes to lose the electrochromic characteristic of the conventional amorphous $WO_3$.

SUMMARY OF THE INVENTION

It is an object of the present invention to provide an electrochromic film which has excellent electrochromic reversibility after a heat-treatment at a temperature ranging from 250° C. to 350° C.

It is another object of the present invention to provide an electrochromic device having high reliability which is prepared by using the electrochromic film.

The foregoing and other objects of the present invention have been attained by a vacuum evaporation under relatively high pressure. ($2\times10^{-4} - 2\times10^{-3}$ torr) to give less than 0.65 of a packing density of the evaporated electrochromic film.

DETAILED DESCRIPTION OF THE PREFERRED EMBODIMENTS

Figure 1:
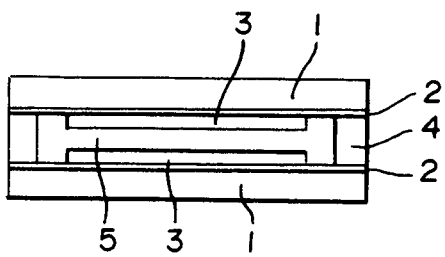
FIG. 1 is a sectional view of an electrochromic device.

In the present invention, the known electrochromic materials such as $WO_3$ and $MoO_3$ can be used. Especially, $WO_3$ has excellent electrochromic characteristics. When a known additive such as $Ta_2O_5$, $TiO_2$, $Nb_2O_5$ and $V_2O_5$ or a new additive of $B_2O_3$ which is found by the inventors is incorporated, the crystallizing temperature of $WO_3$ can be increased to be preferable for the feature of the present invention.

In accordance with the present invention, an electrochromic material or a mixture of the electrochromic material and the additive are deposited, by a vacuum evaporation, on a substrate having an electrode to form a film. A packing density of the resulting film should be less than 0.65.

The packing density is limited to less than 0.65, because the electrochromic characteristic especially the bleaching property is not enough to impart reversibility when it is heated at higher than 250° C. in the case of higher packing density.

In order to form an electrochromic film having a packing density of less than 0.65, a vacuum degree is relatively low vacuum degree such as lower than $2\times10^{-4}$ torr in a vacuum evaporation device in the case using $WO_3$ as the electrochromic material though it is depending upon a kind of the electrochromic material, a kind of a gas used in the vacuum evaporation device or in the leakage. The films formed in the vacuum degree of $2\times10^{-4} - 2\times10^{-3}$ torr especially $5\times10^{-4} - 2\times10^3$ torr have excellent electrochromic characteristics even after the heat-treatment at higher than 250° C. and a temperature maintaining an amorphous film (lower than about 350° C.). (Vacuum degree in conventional one was about $10^{-5}$ torr.)

As described above, the electrochromic film of the present invention has an improved heat resistance. Accordingly, it is possible to use a sealant which should be used by heating but has high reliability such as organic polymers e.g. tetrafluoroethylene-ethylene copolymers. An adhesive strength of the electrochromic film to the substrate is also improved by the heat-treatment. Electrochromic device having high reliability can be obtained. The heat-treatment can be carried out before assembling. However, the heat-treatment can be carried out at the time heating a sealant for the sealing, when a sealant which is sealed by heating is used.

The present invention will be further illustrated by certain examples and references which are provided for purposes of illustration only and are not intended to the limiting the present invention.

EXAMPLE 1

A vacuum evaporation device was evacuated to be a vacuum degree of higher than $1 \times 10^{-5}$ torr. A dried air was leaked to adjust the vacuum degree in the device. A deposition film of $WO_3$ was formed in a thickness of 5000 Å, on a glass substrate having a coated transparent electrode layer set in the device at an evaporation speed of 5 Å/second. Packing densities of electrochromic films formed in vacuum degrees of $6 \times 10^{-5}$ torr, $2 \times 10^{-4}$ torr, and $6 \times 10^{-4}$ torr were respectively 0.82, 0.62 and 0.54.

Three kinds of the substrates were respectively heat-treated at 300° C. for 20 minutes. The substrates were respectively used as their displaying electrodes and a lithium tungsten bronze electrode was used as the other electrode and a solution of anhydrous $LiClO_4$ in propylenecarbonate which was carefully dehydrated and deoxidized at a concentration of 1 mole/liter was used as an electrolyte and a voltage of 1.5 Volt was applied.

Figure 2:
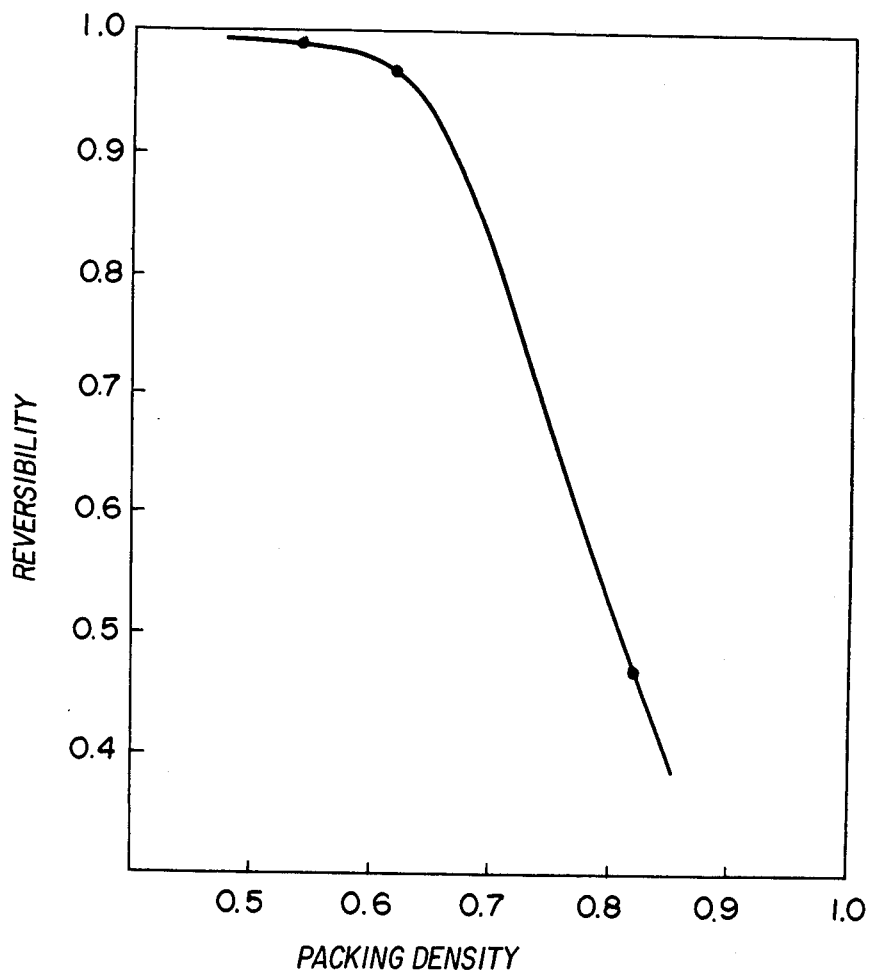
FIG. 2 is a graph showing relation of packing densities of electrochromic film and electrochromic reversibility.

An electrochromic reversibility was given as a ratio of a quantity of electricity passed in the coloring time and that of the bleaching time. The electrochromic reversibilities measured are plotted in FIG. 2. It is found that the electrochromic reversibility is remarkably excellent at the packing density of less than 0.65 before the heat-treatment.

EXAMPLE 2

A vacuum evaporation device was evacuated to be a vacuum degree of higher than $1 \times 10^{-5}$ torr. A dried air was leaked to adjust the vacuum degree to $6 \times 10^{-4}$ torr in the device. A deposited film of $WO_3$ was formed in a thickness of 5000 Å on a glass substrate having a coated transparent electrode layer set in the device at an evaporation speed of 5 Å/second. An electrochromic device was assembled by heat-sealing a pair of the substrates with a sealant of tetrafluoroethyleneethylene copolymer at 300° C. for 20 minutes. A solution of anhydrous $LiClO_3$ in a propylene-carbonate which was carefully dehydrated and deoxidized at a concentration of 1 mole/liter was used as an electrolyte by filling it in the device. The electrolyte was injected into the cell under vacuum through one fill-hole, the periphery of which, prior to injection was vacuum-metallized by Cr-Cu-Au. Then the fill-hole was sealed using low melting metal solder.

The electrochromic device was used by feeding rectangular wave current at 2.0 Volt and 0.3 Hz for 1,000,000 pulses. However, no deterioration was found.

EXAMPLE 3

In accordance with the process of Example 2 except using $WO_3$ incorporating 20 wt.% of $Ta_2O_5$, an electrochromic device was prepared and tested for 1,000,000 pulses. No deterioration was found.

EXAMPLE 4

In accordance with the process of Example 2 except using $WO_3$ incorporating 20 wt.% of $B_2O_3$, an electrochromic device was prepared and treated for 1,000,000 pulses. No deterioration was found.

What is claimed is:

1. A process for forming an amorphous electrochromic film upon a substrate having an electrode which comprises carrying out a vacuum evaporation and deposition of electrochromic material under a pressure of $2 \times 10^{-4}$ to $2 \times 10^{-3}$ torr upon said substrate having an electrode to provide an electrochromic film, and then, carrying out a heat-treatment.

2. A process according to claim 1 wherein the electrochromic film is made of tungsten oxide.

3. A process according to claim 1 wherein the electrochromic film is made of tungsten oxide incorporating at least one selected from the group consisting of $TiO_2$, $Ta_2O_5$, $Nb_2O_5$ and $V_2O_5$.

4. A process according to claim 1 wherein the electrochromic film is made of tungsten oxide incorporating about 20 wt.% $B_2O_3$.

5. A process according to claim 1, 2, 3 or 4 wherein the electrochromic film is formed in a vacuum evaporation chamber having a pressure of $5 \times 10^{-4} - 2 \times 10^{-3}$ torr.

6. A process according to claim 1, 2, 3 or 4, wherein a temperature in the heat-treatment is ranging from 250° to 350° C.

7. A process according to claim 5, wherein a temperature in the heat-treatment is ranging from 250° to 350° C.

* * * * *